US012687600B2

(12) United States Patent
Paul et al.

(10) Patent No.: US 12,687,600 B2
(45) Date of Patent: Jul. 21, 2026

(54) METHOD FOR PARAMETERIZING A GRADIENT PERFORMANCE OF A MAGNETIC RESONANCE IMAGING SYSTEM USING AN ELECTRONIC COMPUTING FACILITY, COMPUTER PROGRAM PRODUCT, COMPUTER-READABLE STORAGE MEDIUM, ELECTRONIC COMPUTING FACILITY, AND MAGNETIC RESONANCE IMAGING SYSTEM

(71) Applicant: Siemens Healthcare GmbH, Erlangen (DE)

(72) Inventors: Dominik Paul, Bubenreuth (DE); Mario Zeller, Erlangen (DE); Flavio Carinci, Würzburg (DE); Carsten Prinz, Baiersdorf (DE); Max Müller, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 168 days.

(21) Appl. No.: 18/524,979

(22) Filed: Nov. 30, 2023

(65) Prior Publication Data

US 2024/0201301 A1     Jun. 20, 2024

(30) Foreign Application Priority Data

Dec. 15, 2022     (DE) ..................... 10 2022 213 699.3

(51) Int. Cl.
*G01V 3/00*     (2006.01)
*G01R 33/54*     (2006.01)

(52) U.S. Cl.
CPC .................................. *G01R 33/543* (2013.01)

(58) Field of Classification Search
CPC .......... G01R 33/56341; G01R 33/4824; G01R 33/5608
USPC ........................................................ 324/309
See application file for complete search history.

(56) References Cited

U.S. PATENT DOCUMENTS

| | | | | |
|---|---|---|---|---|
| 6,198,282 B1 * | 3/2001 | Dumoulin | .............. | G01R 33/54 |
| | | | | 324/309 |
| 2018/0120401 A1 * | 5/2018 | Shin | .................... | G01R 33/4822 |
| 2020/0064426 A1 * | 2/2020 | Ersoz | ................. | G01R 33/3852 |

FOREIGN PATENT DOCUMENTS

| | | | | |
|---|---|---|---|---|
| DE | 4426773 A1 * | 2/1995 | .......... | G01R 33/385 |
| WO | WO-03046597 A1 * | 6/2003 | ........ | G01R 33/3854 |

* cited by examiner

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method for parameterizing a gradient performance of a magnetic resonance imaging system using an electronic computing facility of the magnetic resonance imaging system includes specifying a first limit value for the gradient performance in dependence on potential nerve stimulation of a patient, and specifying a second limit value for the gradient performance in dependence on potential cardiac muscle stimulation of the patient. The method also includes parameterizing a maximum gradient amplitude of a pulse of the gradient performance and a slew rate of the pulse in dependence on the first limit value and the second limit value.

18 Claims, 1 Drawing Sheet

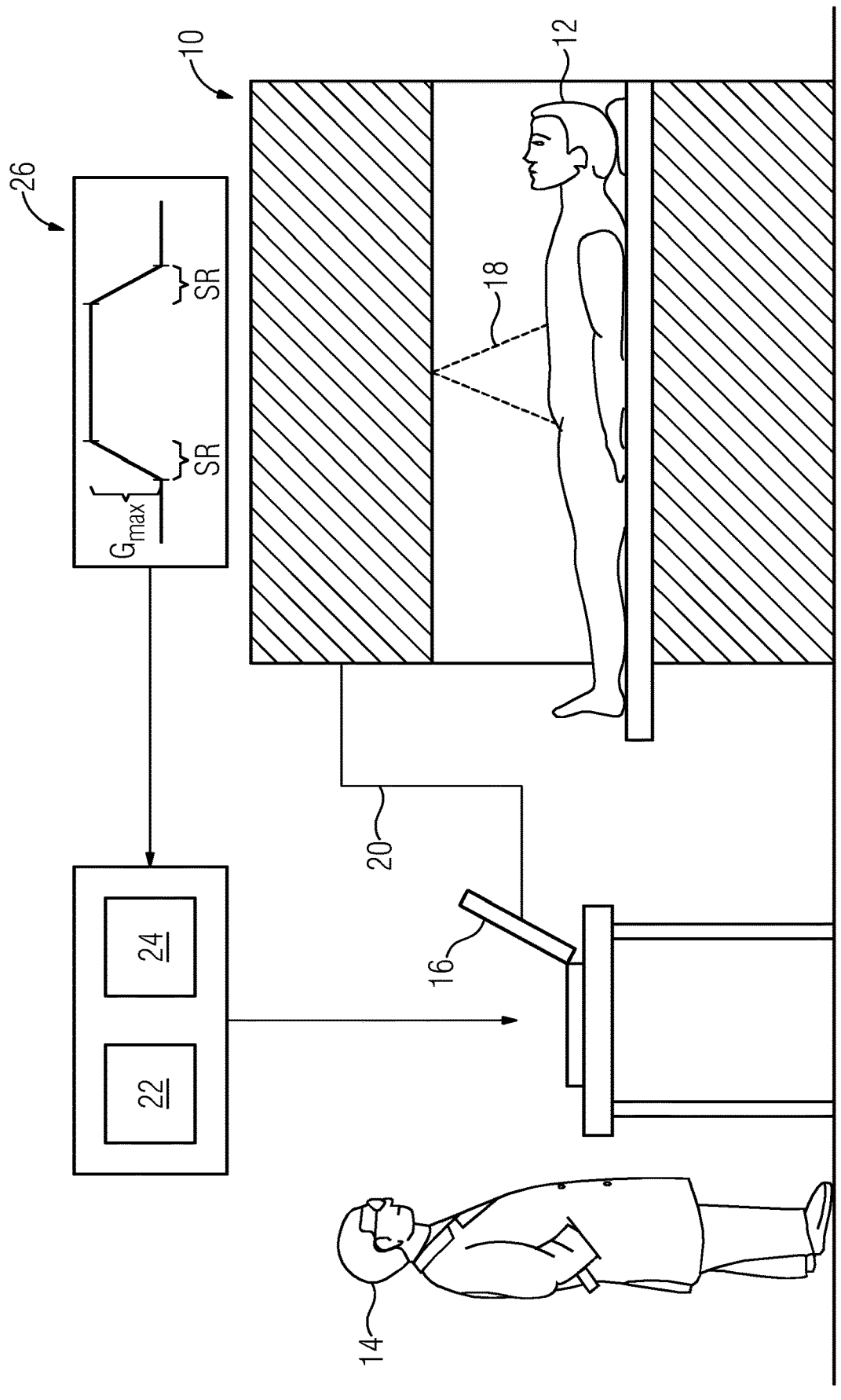

METHOD FOR PARAMETERIZING A GRADIENT PERFORMANCE OF A MAGNETIC RESONANCE IMAGING SYSTEM USING AN ELECTRONIC COMPUTING FACILITY, COMPUTER PROGRAM PRODUCT, COMPUTER-READABLE STORAGE MEDIUM, ELECTRONIC COMPUTING FACILITY, AND MAGNETIC RESONANCE IMAGING SYSTEM

This application claims the benefit of German Patent Application No. DE 10 2022 213 699.3, filed on Dec. 15, 2022, which is hereby incorporated by reference in its entirety.

BACKGROUND

The present embodiments relate to a method for parameterizing a gradient performance of a magnetic resonance imaging system using an electronic computing facility of the magnetic resonance imaging system. Further, the present embodiments relate to a computer program product, a computer-readable storage medium, an electronic computing facility, and a magnetic resonance imaging system.

Corresponding magnetic resonance imaging (MRI) systems are already known from the prior art. For example, corresponding limitations in clinical routine are known in the case of systems with a corresponding gradient performance, where these limit values are specified for potential nerve stimulation (PNS) or cardiac stimulation (CNS). It may be the case that examination procedures cannot be performed due to high gradient performance (e.g., depending on the orientation). Then, a search algorithm is used to find a suitable parameter configuration to keep the examination procedure below the limit values for stimulation.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method, a computer program product, a computer-readable storage medium, an electronic computing facility, and a magnetic resonance imaging system, by which improved parameterization of the magnetic resonance imaging system (e.g., the gradient performance of the magnetic resonance imaging system) may be determined, are provided.

One aspect of the present embodiments relate to a method for parameterizing a gradient performance of a magnetic resonance imaging system an electronic computing facility (e.g., a computing device including one or more processors) of the magnetic resonance imaging system. A first limit value for the gradient performance is specified in dependence on potential nerve stimulation of a patient, and a second limit value for the gradient performance is specified in dependence on potential cardiac muscle stimulation of the patient. Then, a maximum gradient amplitude of a pulse or a sequence of the gradient performance and a slew rate of the pulse are parameterized in dependence on the first limit value and the second limit value.

Hence, for example, the rise time (RT), which corresponds to the reciprocal value of the slew rate (SR), where the slew rate corresponds to the rise rate, is also taken into account. These parameters are now checked together, where, for example, the slew rate has a very strong influence on stimulation and hence provides a good starting point for a potential search for a solution. Hence, for example, in addition to the slew rate, the maximum gradient amplitude is also reduced, for example, so that a better solution may be found. Reducing the gradient amplitude has the effect of, for example, prolonging the total duration of the gradient, but simultaneously correspondingly shortening the ramps (e.g., the rising and falling edges of a gradient and increasing the distance between ramps). Since, due to the field change, the ramps are the cause of the stimulation, this is a preferred setup.

For example, a user protocol may be specified that specifies an echo time of TE 10 ms, which leads to stimulation. The corresponding search algorithm finds a solution solely by reducing the slew rate, and the resulting protocol has an echo time of TE 12 ms, for example. According to the present embodiments, if, in addition to the slew rate, the maximum gradient amplitude is now also reduced, a better solution is found so that, for example, an echo time of 11 ms is recorded, which is significantly closer to the originally required echo time of 12 ms. Hence, for example, the solution provides for the maximum gradient amplitude for the imaging sequences to be linked to the changes in the rise time/slew rate when a solution is sought.

Hence, for example, a method is provided for automatically adjusting sequence parameters with minimal impact on imaging.

According to an embodiment, when the slew rate is reduced, the maximum gradient amplitude is also reduced. For example, the slew rate may be reduced by a same percentage as the maximum gradient amplitude is reduced. Hence, a case requiring very reduced effort may be presented in which the slew rate and the maximum gradient amplitude are reduced by the same percentage. This may, for example, be performed based on the following formula:

$$SR` = x * SR \text{ and } G`_{max} = x * G_{max},$$

where SR corresponds to the slew rate, x corresponds to the reduction factor, and $G_{max}$ corresponds to the maximum gradient amplitude.

Alternatively, in an alternative embodiment, it may be provided that the slew rate is reduced by a first percentage, and the maximum gradient amplitude is reduced by a second percentage that depends on the first percentage.

Hence, for example, a dependent reduction with different scaling may be provided, for example, according to the following formula:

$$SR` = x * SR \text{ and } G`_{max} = a * x * G_{max},$$

where a is an arbitrary constant in a value range of, for example, between 0.1 and 10.

Hence, the parameters may, for example, be correspondingly adjusted specifically for the patient or specifically for the user.

In one embodiment, a field-of-view of the magnetic resonance imaging system in the parameterization may be additionally taken into account. Further, it may also be provided that a slice thickness of a patient examination is also taken into account in the parameterization in dependence on specified patient information. Hence, this enables the search algorithm also to use, for example, the field-of-view size (e.g., a size of an image), the magnetic resonance imaging system, and the slice thickness, thus enabling a reliable search for a solution for the corresponding parameterization to be provided.

A further embodiment provides that the magnetic resonance imaging system is configured as a magnetic resonance imaging system with a high maximum gradient performance. For example, the maximum gradient strength of the magnetic resonance imaging system may be specified as >=80 mT/m, and/or the maximum slew rate of the magnetic resonance imaging system may be specified as >=150 mT/(m*ms). For example, in the case of systems with a high gradient performance, the limit values for potential nerve stimulation or cardiac stimulation are a corresponding limitation. Hence, the method is, for example, advantageous for use in such systems since further possible solutions for a user may hence be suggested.

Further, it has been shown to be advantageous for model-specific limit values to be ascertained based on the parameterization. For example, it is then possible to determine the limit values for a corresponding model of the magnetic resonance imaging system. As a result of this, it will be easier to find the corresponding parameter setting in the future.

A further embodiment provides that individual parameter values for the parameterization are displayed to a user of the magnetic resonance imaging system. For example, the corresponding parameter values for the parameterization may be displayed on an optical display facility (e.g., in the form of a display). These may then also be changed accordingly, for example, based on user input, or corresponding solutions may be determined and displayed.

The method is, for example, a computer-implemented method. Therefore, a further aspect of the present embodiments relates to a computer program product with program code means that cause an electronic computing facility to perform a method according to the preceding aspect when the program code means are processed by the electronic computing facility. The computer program product may also be referred to as a computer program product.

Further, the present embodiments also relate to a computer-readable storage medium (e.g., a non-transitory computer-readable storage medium) with at least one computer program product according to the preceding aspect.

Another further aspect of the present embodiments also relates to an electronic computing facility for a magnetic resonance imaging system for parameterizing a gradient performance of the magnetic resonance imaging system. The electronic computing facility is configured to perform a method according to the preceding aspect. For example, the method is performed by the electronic computing facility.

The electronic computing facility has, for example, processors, circuits (e.g., integrated circuits), and further electronic components in order to be able to perform corresponding method acts.

Further, the present embodiments also relate to a magnetic resonance imaging system with an electronic computing facility according to the preceding aspect.

Advantageous embodiments of the method are to be regarded as advantageous embodiments of the electronic computing facility and the magnetic resonance imaging system. For this purpose, the magnetic resonance imaging system and the electronic computing facility, for example, have substantive features that enable corresponding method acts to be performed.

For cases or situations that may arise with the use of the method and are not explicitly described here, it may be provided that, according to the method, an error message and/or a request for user feedback is output, and/or a default setting and/or a predetermined initial state is set.

Regardless of the grammatical gender of a specific term, individuals who identify as male, female, or another gender are also included.

BRIEF DESCRIPTION OF THE DRAWING

FIG. 1 shows a schematic side view of an embodiment of a magnetic resonance imaging system with an embodiment of an electronic computing facility.

In the FIGURE, same or functionally same elements are given same reference symbols.

DETAILED DESCRIPTION

FIG. 1 shows a schematic side view of an embodiment of a magnetic resonance imaging system 10. The magnetic resonance imaging system 10 is, for example, configured to treat a patient 12. Herein, the magnetic resonance imaging system 10 is operated by a user 14, for example, in the sense of an operator of the magnetic resonance imaging system 10. For this purpose, the user 14 may make corresponding entries for protocols on a computer (e.g., in the form of an electronic computing facility 16). The magnetic resonance imaging system 10 is further configured to emit a gradient performance 18. The gradient performance 18 is generated based on parameter values 20. The magnetic resonance imaging system 10 may, for example, be used to generate images of the internal organs of the patient 12. Hence, this is, for example, an imaging method.

In the method for parameterizing the gradient performance 18, it may be provided that a first limit value 22 for the gradient performance 18 is specified in dependence on potential nerve stimulation of the patient 12 and a second limit value 24 for the gradient performance 18 is specified in dependence on potential cardiac muscle stimulation of the patient 20. A maximum gradient amplitude $G_{max}$ of a pulse 26 of the gradient performance 18 and a slew rate SR of the pulse 26 are then parameterized in dependence on the first limit value 22 and the second limit value 24.

For example, FIG. 1 shows that, for example, when the slew rate SR is reduced, the maximum gradient amplitude $G_{max}$ is also reduced. Herein, the slew rate SR may be reduced by a same percentage as the maximum gradient amplitude $G_{max}$ is reduced. Alternatively, it may be provided that the slew rate SR is reduced by a first percentage, and the maximum gradient amplitude $G_{max}$ is reduced by a second percentage that depends on the first percentage.

Hence, for example, FIG. 1 shows that, in addition to the slew rate SR, the maximum gradient amplitude $G_{max}$ is also reduced in order in this way to achieve a better solution in the case of systems with high gradient performance. For example, the reduction in the maximum gradient amplitude $G_{max}$ has the effect of prolonging the overall duration of the gradient, but at the same time, the reduction in the maximum gradient amplitude $G_{max}$ shortens the ramps correspondingly (e.g., the rising or falling edges of the gradient) and increases a distance between the ramps to a greater extent. Since, due to the field change, the ramps are the cause of the stimulation, this is a preferred setup.

Hence, for example, the solution provides for the maximum gradient amplitude $G_{max}$ for the imaging sequences to be coupled to the changes in the slew rate SR when searching for a solution.

In the simplest case, if the slew rate SR is reduced by x %, $G_{max}$ is also reduced by x %.

Generally:

$$SR^{\iota} = x * SR \text{ and } G^{\iota}_{max} = x * G_{max}$$

A further option is a dependent reduction with different scaling:

$$SR^{\iota} = x * SR \text{ and } G^{\iota}_{max} = a * x * G_{max}$$

Here, a is an arbitrary constant, for example, in a value range between 0.1 and 10.

Generally, an arbitrary coupling $$G^{\iota}_{max} = f(x) * G_{max}$$

may be used. Possible examples are:

$$f(x) = a * x$$

or $$f(x) = a * x^2 + b * x + c,$$

or further dependencies are also possible.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for parameterizing a gradient performance of a magnetic resonance imaging system using an electronic computing facility of the magnetic resonance imaging system, the method comprising:

specifying a first limit value for the gradient performance in dependence on potential nerve stimulation of a patient, and specifying a second limit value for the gradient performance in dependence on potential cardiac muscle stimulation of the patient; and parameterizing a maximum gradient amplitude of a pulse of the gradient performance and a slew rate of the pulse in dependence on the first limit value and the second limit value.

2. In a non-transitory computer-readable storage medium that stores instructions executable by one or more processors for parameterizing a gradient performance of a magnetic resonance imaging system, the instructions comprising:

specifying a first limit value for the gradient performance in dependence on potential nerve stimulation of a patient, and specifying a second limit value for the gradient performance in dependence on potential cardiac muscle stimulation of the patient; and parameterizing a maximum gradient amplitude of a pulse of the gradient performance and a slew rate of the pulse in dependence on the first limit value and the second limit value.

3. An electronic computing facility for a magnetic resonance imaging system for parameterizing a gradient performance of the magnetic resonance imaging system, the electronic computing facility comprising:

a processor configured to:

specify a first limit value for the gradient performance in dependence on potential nerve stimulation of a patient, and specify a second limit value for the gradient performance in dependence on potential cardiac muscle stimulation of the patient; and parameterize a maximum gradient amplitude of a pulse of the gradient performance and a slew rate of the pulse in dependence on the first limit value and the second limit value.

4. A magnetic resonance imaging system comprising:

an electronic computing facility for parameterizing a gradient performance of the magnetic resonance imaging system, the electronic computing facility comprising:

a processor configured to:

specify a first limit value for the gradient performance in dependence on potential nerve stimulation of a patient, and specify a second limit value for the gradient performance in dependence on potential cardiac muscle stimulation of the patient; and parameterize a maximum gradient amplitude of a pulse of the gradient performance and a slew rate of the pulse in dependence on the first limit value and the second limit value.

5. The method of claim 1, wherein, when the slew rate is reduced, the maximum gradient amplitude is also reduced.

6. The method of claim 1, wherein a field-of-view of the magnetic resonance imaging system is also taken into account in the parameterizing.

7. The method of claim 1, wherein a slice thickness of the patient is also taken into account in the parameterizing in dependence on specified patient information.

8. The method of claim 1, wherein the magnetic resonance imaging system is configured as a magnetic resonance imaging system with a high maximum gradient performance.

9. The method of claim 1, further comprising ascertaining model-specific limit values based on the parameterizing.

10. The method of claim 1, further comprising displaying individual parameter values for the parameterizing to a user of the magnetic resonance imaging system.

11. The non-transitory computer-readable storage medium of claim 2, wherein, when the slew rate is reduced, the maximum gradient amplitude is also reduced.

12. The non-transitory computer-readable storage medium of claim 2, wherein a field-of-view of the magnetic resonance imaging system is also taken into account in the parameterizing.

13. The non-transitory computer-readable storage medium of claim 2, wherein a slice thickness of the patient is also taken into account in the parameterizing in dependence on specified patient information.

14. The non-transitory computer-readable storage medium of claim 2, wherein the magnetic resonance imaging system is configured as a magnetic resonance imaging system with a high maximum gradient performance.

15. The method of claim 5, wherein the slew rate is reduced by a same percentage as the maximum gradient amplitude is reduced.

16. The method of claim 5, wherein the slew rate is reduced by a first percentage, and the maximum gradient amplitude is reduced by a second percentage that depends on the first percentage.

17. The non-transitory computer-readable storage medium of claim 11, wherein the slew rate is reduced by a same percentage as the maximum gradient amplitude is reduced.

18. The non-transitory computer-readable storage medium of claim 11, wherein the slew rate is reduced by a first percentage, and the maximum gradient amplitude is reduced by a second percentage that depends on the first percentage.

\* \* \* \* \*